United States Patent

[11] 3,601,723

[72] Inventor Albert Henry Johnson
Christchurch, England

[21] Appl. No. 864,498
[22] Filed Oct. 7, 1969
[45] Patented Aug. 24, 1971
[73] Assignee National Research Development Corporation
London, England
[32] Priority Oct. 8, 1968
[33] Great Britain
[31] 47,655/68

[54] ELECTRONIC TUNING APPARATUS FOR MICROWAVE CIRCUITS
6 Claims, 6 Drawing Figs.

[52] U.S. Cl. 334/15, 331/96, 332/30, 333/83
[51] Int. Cl. H03j 3/06
[50] Field of Search 334/14, 15; 331/96; 332/30; 333/83

[56] References Cited

UNITED STATES PATENTS

| | | | |
|---|---|---|---|
| 3,246,266 | 4/1966 | Racy | 334/15 X |
| 3,443,247 | 5/1969 | Fjerstad | 334/15 X |
| 3,508,177 | 4/1970 | Suzuki | 334/15 |
| 3,512,105 | 5/1970 | Lance, Jr. et al. | 334/15 |

*Primary Examiner*—Herman Karl Saalbach
*Assistant Examiner*—Saxfield Chatmon, Jr.
*Attorney*—Cushman, Darby & Cushman

ABSTRACT: Tuning apparatus for a resonant cavity comprises a varactor diode capacitively coupled into the cavity by means of a half-wavelength of, or *n* half-wavelengths of, a transmission line, and a return path for the varactor current is provided by an inductive member connected a quarter-wavelength from one end of the line. Bias current supply leads, with a bypass capacitor connected across them, are connected either in series with the varactor diode or in series with the inductive member. The inductive member may be a spiral wire.

PATENTED AUG 24 1971 3,601,723

Figure 2:
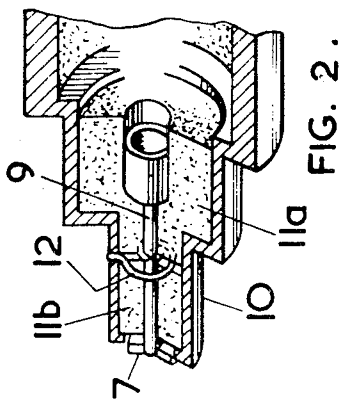

Inventor
ALBERT HENRY JOHNSON
By CUSHMAN, DARBY + CUSHMAN
Attorneys

Inventor
ALBERT HENRY JOHNSON
By CUSHMAN, DARBY & CUSHMAN
Attorneys

ELECTRONIC TUNING APPARATUS FOR MICROWAVE CIRCUITS

The present invention relates to electronic tuning apparatus for microwave circuits and in particular to apparatus for tuning coaxial resonant cavities by means of varactor diodes.

Known methods of tuning resonant cavities with varactor diodes suffer from various disadvantages. The varactor diode is usually coupled into the cavity by means of a coupling loop. Such loops perform two functions, that of coupling the varactor diode into the magnetic field of the cavity and that of providing a direct current return path for the diode-biasing current. This form of coupling may produce parasitic resonances at which the coupling loop inductance forms a resonant circuit with the capacitance of the varactor diode. This resonant circuit forms a load which is in parallel with the resonant circuit of the cavity and can cause an undesirable transfer of power from the desired frequency of the cavity to the unwanted frequency of the parasitic resonance. A further disadvantage is that it may cause "mixed coupling" effects, that is to say the loop acts partly as a probe capacitively coupled to the electric field in the cavity and partly as a loop inductively coupled to the magnetic field in the cavity. In some conditions the capacitively coupled signal can practically cancel the effect of the inductively coupled signal, so that the frequency of the cavity becomes insensitive to adjustments of the tuning circuit.

It is an object of the present invention to provide a method of coupling a varactor diode into the electric field only of a resonant cavity by means of a capacitive probe or plate.

A difficulty arises with coupling a diode into a cavity by such means, in that it is necessary to provide a direct current return path for the diode-biasing current. Such return paths may seriously load the resonant cavity and cause spurious resonances.

According to the present invention, there is provided apparatus for electronically tuning an electromagnetically resonant structure, including a transmission line electrically substantially $n\lambda/2$ long where $n$ is an integer and $\lambda/2$ is half-wavelength at the resonant frequency of the structure, connected at one end to the resonant structure so that it will be capacitively coupled to the electric field of an electromagnetic wave resonant therein, and connected at its other end to a varactor capacitance; an inductive member connected to the transmission line substantially a quarter-wavelength $\lambda/4$ from one end; bias current supply means for passing an adjustable current in series through the inductive member and the varactor capacitance; and a bypass capacitor connected in parallel with the bias current supply means. In this arrangement, the inductive member provides a return path for the bias current used to adjust the varactor capacitance. The coupling to the cavity is therefore relieved of any need to act as a direct current return path, and can be made wholly capacitive, avoiding any "mixed coupling" effects. At a quarter-wavelength from either end of the transmission line the equivalent-circuit impedance at the resonant frequency will be comparatively low, so that a direct current connection can be provided in the form of a short spiral of thin wire which will have an inductive impedance at the resonant frequency considerably greater than the equivalent-circuit impedance at this position, and will therefore have a negligible effect in the resonant frequency equivalent circuit. Spurious resonances in this form of varactor diode circuit are least likely to be troublesome than the corresponding resonances in a conventional loop-coupled arrangement. The electrical length of the transmission line is preferably one half-wavelength, with the inductive connection approximately at its electrical midpoint. Other integral values of $n$ may be used, but practical considerations will in most applications favor the use of the lowest possible value.

The tuning apparatus herein described may be used, for instance, in an automatic frequency control system for controlling the operating frequency of a Gunn oscillator or other microwave apparatus.

Figure 1:
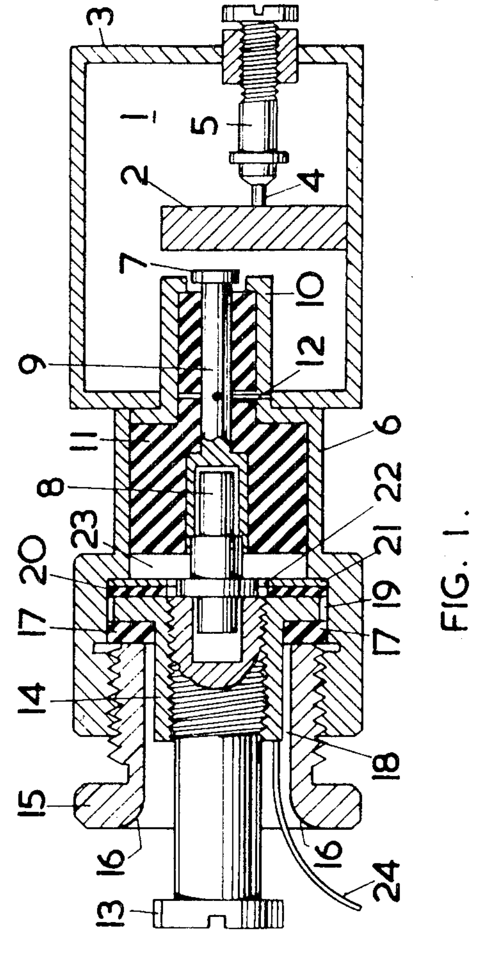
Figure 3:
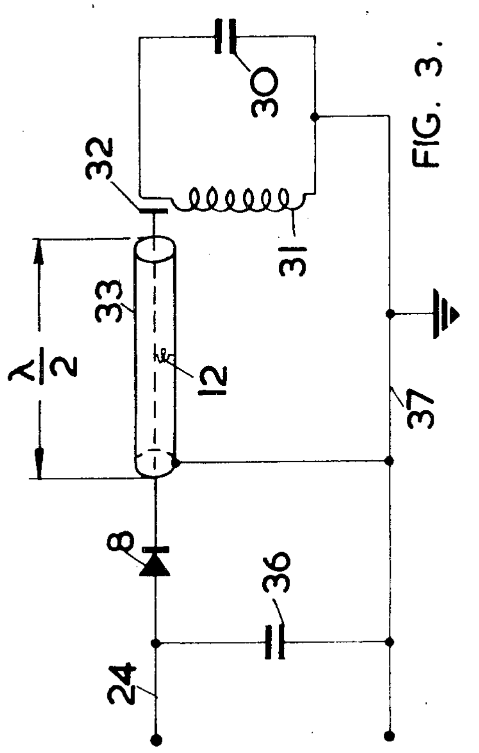
Figure 4:
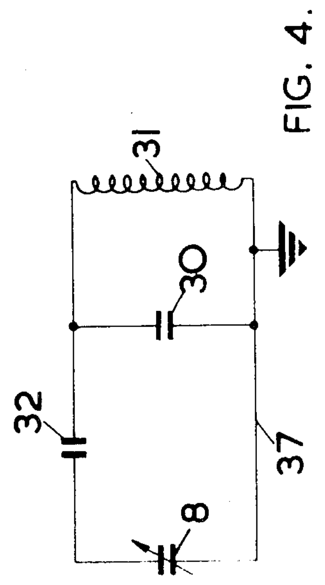
Figures 5, 6:
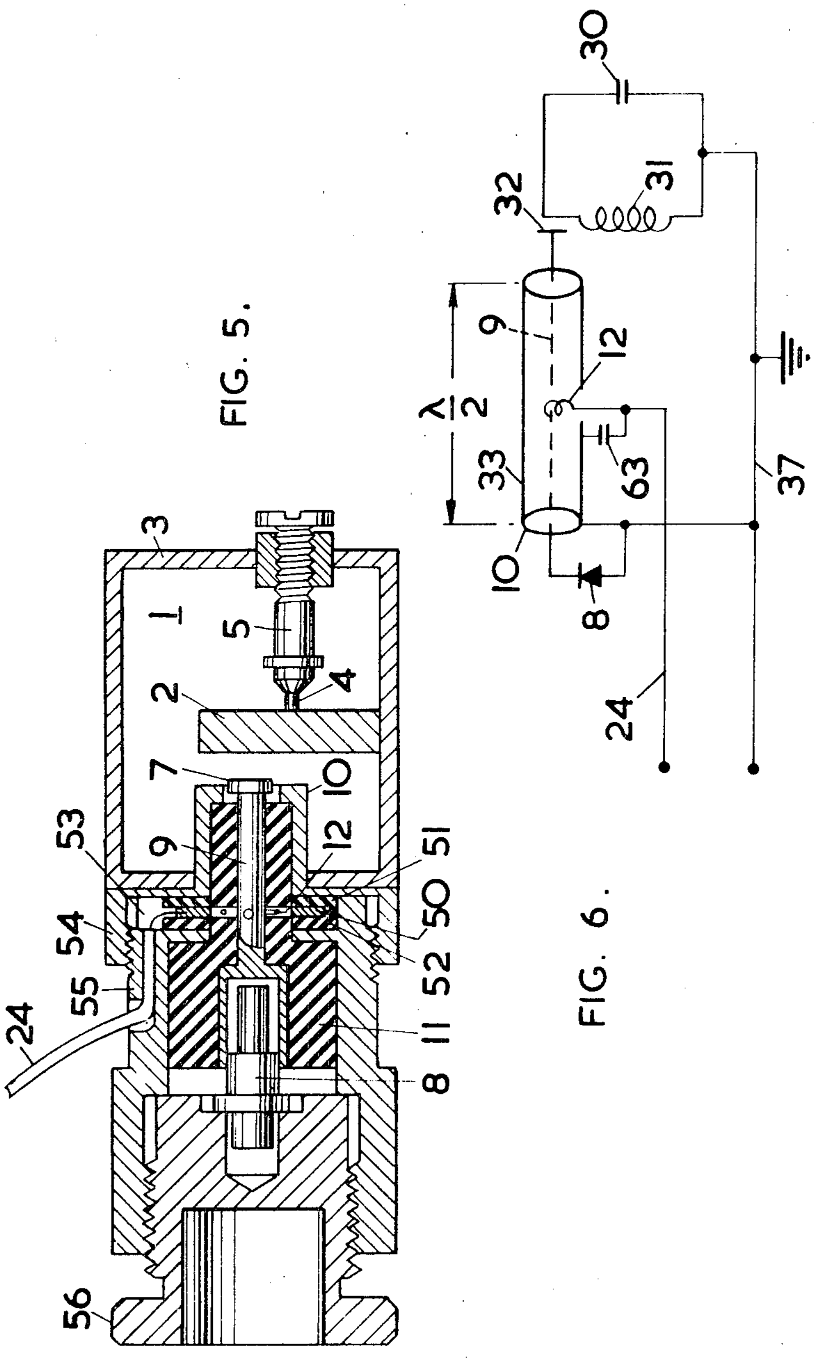

In order that the invention may be more fully understood, embodiments thereof will now be described with reference to the accompanying drawings of which:

FIG. 1 is a section of a Gunn diode coaxial resonant cavity oscillator provided with a varactor diode-tuning head, FIG. 2 is a partly cut away perspective view of part of the varactor tuning head of FIG. 1, FIG. 3 is a high frequency electrical equivalent circuit diagram for the resonant cavity and varactor tuning head of FIG. 1, FIG. 4 is an equivalent circuit diagram of the circuit of FIG. 3, FIG. 5 is a section of a modified form of the oscillator and tuning head of FIGS. 1 and 2, and FIG. 6 is a high frequency electrical equivalent circuit diagram for the resonant cavity and the modified form of varactor tuning head shown in FIG. 5.

It should be understood that these drawings are not necessarily drawn to scale and that they are simplified to exclude power supplies, mechanical tuning arrangements and other details.

FIG. 1 shows a resonant cavity 1 having an inner conductor 2 coaxial with an outer conductor 3. A Gunn diode 4 is mounted on an adjusting screw 5 so that one of its electrodes is in contact with the inner conductor 2 and the other electrode is in contact with the screw 5. A varactor diode-tuning head 6 protrudes into the cavity 1 so that a capacitive coupling plate 7 is situated in the electric field between the inner and outer conductors 2 and 3 respectively. The plate 7 is connected to the cathode of a varactor diode 8 by an inner conductor 9. An outer cylindrical conductive wall 10 of the tuning head 6 is insulated from the inner conductor 9 by dielectric material 11. The inner conductor 9 is connected to the outer conductor 10 by a direct current connection 12. The arrangement of the connection 12 is shown more clearly in FIG. 2 to be described hereinafter. The inner conductor 9 is adapted to receive the varactor diode 8. A screw 13 is engaged with a threaded conductive nut 14 to retain the varactor diode 8 and to make electrical contact therewith. An annular member 15 is screwed into a threaded portion of the outer wall of the tuning head 6. The annular member 15 has a flared portion 16 which provides clearance between the member 15 and the screw 13. The conductive nut 14 is electrically insulated from the member 15 by a dielectric washer 17 and an annular airgap 18. The nut 14 is also electrically insulated from the outer conductive wall 10 by an annular airgap 19 and by a dielectric washer 20. A metallic washer 21 makes contact with the outer conductor 10. An airgap 22 provides clearance between the metallic washer 21 and the flange of the diode 8. An airgap 23 separates the washer 21 from the dielectric material 11. A line 24 connects the anode of the diode 8 to a bias voltage supply (not shown) via the screw 13 and the conductive nut 14.

The drawing of FIG. 2 shows part of the varactor tuning head 6 more clearly. Those parts of FIG. 2 which are identical with parts of FIG. 1 have the same reference numbers.

The connection 12 is clearly shown as a short spiral of fine wire connected at its inner end to the inner conductor 9 and at its outer end to the outer conductor 10. The dielectric material 11 is provided in two parts 11*a* and 11*b*, with clearance between them to accommodate the connection 12.

The mode of operation of the embodiment of the invention will now be described with reference to the circuit diagrams of FIGS. 3 and 4. The dielectric washer 20 provides a high frequency bypass capacitance between the anode connection of the varactor diode 8 and the metalic washer 21 which is contact with the outer wall of the tuning head 6. The outer wall of the tuning head 6 is in electrical contact with the outer conductor 3 of the coaxial resonant cavity 1. The distance between the plate 7 and the flange of the diode 8 is substantially a half-wavelength at the operating frequency of the resonant cavity. The conductor 9 together with the cylindrical wall 10 and the dielectric material 11 forms a section of coaxial transmission line. The connection 12 is positioned midway on this line i.e. at an electrical distance of λ/4 from either end. The capacitance between the anode connection of the diode 8 and the outer wall of the tuning head provides an effective short circuit at that point, at microwave frequencies.

FIG. 3 shows an electrical equivalent circuit of the embodiment of FIG. 1. Those parts of FIG. 1 which can be represented directly in FIG. 3 are given the same reference numbers. The capacitance 30 together with the parallel inductance 31 represent the resonant cavity. The capacitor 32 represents the coupling capacity between the plate 7 and the cavity 1. It is connected by a λ/2 section of coaxial transmission line 33 to the cathode of the varactor diode 8. The anode of the varactor diode 8 is connected to a bias voltage supply line 24 and to one terminal of a decoupling capacitor 36. The outer terminal of the capacitor 36 is connected to a common supply line 37 together with the outer conductor of the section of transmission line 33 and one end of the resonant cavity equivalent circuit (30 and 31). The decoupling capacitor 36 represents the capacitance between the anode electrode of the diode 8 and the outer wall of the varactor tuning head 6. The outer wall of the tuning head 6 is represented by the common line 37. The inductance 12 is the direct current connection between the inner and outer conductors of the λ/2 transmission line 33.

A half-wave section of transmission line behaves as a 1:1 transformer. Hence in the embodiment described hereinbefore the capacity effects in the diode 8 are reflected, substantially unchanged, to the coupling capacitor plate 7. The varactor diode 8 behaves as a variable capacitance when the bias current through it is varied.

FIG. 4 shows a circuit which is equivalent to that of FIG. 3 at very high frequencies. One plate of the variable capacitor 8 is directly connected to the common line 37 because the decoupling capacitor 36 has negligible impedance at these frequencies. The other plate of the variable capacitor 8 is directly connected to the coupling capacitor 32 because of the 1:1 transformer effect of the λ/2 section of transmission line. The inductance 12 is omitted for reasons which will be explained hereinafter.

The arrangement of FIG. 1 is therefore reduced electrically at very high frequencies to a parallel resonant circuit having connected across it a fixed capacitance 32 in series with a variable capacitance 8. Tuning of the resonant circuit is effected byaltering the value of the capacity 8 which is achieved by varying the reverse bias voltage across the varactor diode. The plate 7 is positioned in an area of relatively high voltage and low current in the cavity that is to say in a position of high impedance.

The standing wave pattern of the λ/2 section of transmission line 33 is such that at its midpoint there will exit a region of very low electric field potential. The impedance *Zlf* at the midpoint may be represented by the equation:

$$Zlf = Zo^2/Zd + Zc$$

where *Zo* is the characteristic impedance of the line 33, *Zd* is the varactor diode load impedance and *Zc* is the loading impedance presented by the resonant cavity 1 via the coupling capacitance 32. Hence the bias current return connection 12 which is placed across the transmission line 33 at its midpoint will therefore have no serious loading effect if the high frequency impedance of the connection 12 is very much greater than impedance *Zlf*.

In practical embodiments of the invention the sum of the impedances *Zd* and *Zc* would normally be greater than 1 kilohm and if the line 33 has a characteristic impedance of 50 ohms then the impedance *Zlf* will be no more than 2.5 ohms. A bias current return path 12 of 40-s.w.g. wire having a length of 1 centimeter would have an impedance of approximately 800 ohms at a frequency of 8 GHz. Such an impedance when placed across the transmission line at its midpoint would produce no significant change in the standing wave pattern and is unlikely to cause any troublesome spurious resonances.

The tuning arrangement herein described is substantially free from mixed coupling effects because the coupling means is an open circuited plate, and therefore cannot link with the magnetic field of the resonant cavity.

While the arrangement of the bypass capacitor and bias current supply lead shown in FIGS. 1 and 2 is mechanically convenient, it is also clearly possible to connect these components in an alternative position as shown in FIG. 5. In this modification, the outer end of the direct current inductive connection member 12 is connected to an annular metallic washer 50, which is sandwiched between dielectric washer 51 and 52. These washers are clamped between parts 54, 55 which in this embodiment are screwed together to form the outer conductor of the tuning head transmission line, so that they will provide a suitable bypass capacitance. The insulated bias current supply lead 24 is passed through a hole, and a slot 53, in the member 55, and is electrically connected to the washer 50. The parts securing the varactor diode 8 are simplified to the form shown with reference 56, which is screwed into the member 55 to make electrical contact between it and the anode of the varactor diode 8. Other parts shown in FIG. 5 are substantially similar to corresponding and similarly labeled parts of the embodiment of FIG. 1.

FIG. 6 shows the equivalent circuit of the modified tuning head arrangement. This clearly includes many parts which correspond to the parts of the circuit of FIG. 3 and are similarly labeled. It is therefore only necessary to describe the features by which the modified circuit differs from the circuit of FIG. 3. It will be noted that the anode of the varactor diode 8 is directly connected to the outer, earthed, conductor 10 of the transmission line. The outer end of the inductive spiral connection wire 12 is connected to the bias current lead 24 and not to the outer conductor 10. The bypass capacitance 63, which is provided by the dielectric washers 51, 52 of FIG. 5, is connected to the inductive wire 12 and to the outer conductor 10 so that it effectively decouples the bias current supply line 24.

At the resonant frequency of the structure, the bypass capacitance 63 should have a negligible impedance, approximating to a short circuit, while the inductive connection 12 should have a comparatively high impedance with negligible effect at the midpoint of the transmission line. It follows that the circuit of FIG. 6 is equivalent to the circuit of FIG. 4 at high frequencies, and will therefore also operate as hereinbefore described with reference to FIG. 4.

It should be clearly understood that the embodiments hereinbefore described have been described by way of example only, as many variations and different applications of this method of tuning will be apparent to those skilled in the art. For example it can be applied to any microwave resonant circuit whether it be a cavity as described hereinbefore or a section of transmission line having suitable standing wave patterns. The polarity of the varactor diode may be reversed, if the polarity of the bias current supply is also reversed.

I claim:

1. Apparatus for electronic tuning an electromagnetically resonant structure,
   - a varactor capacitance,
   - a transmission line, connected at one end to said electromagnetically resonant structure so that it will be capacitively coupled to the electric field of an electromagnetic wave resonant therein, and connected at its other end to said varactor capacitance, said line comprising an inner conductor and an outer conductor and having electrical length substantially equal to *n* times λ/2 where *n* is an integer and λ/2 is a half-wavelength at the resonant frequency of said electromagnetically resonant structure,
   - an inductive member connected to said inner conductor at a position between the said varactor capacitance and the said resonant structure, said position being substantially at an electrical length *m* λ/4 from one end of said transmission line where *m* is an odd integer,
   - bias current supply means, for passing a bias current through said outer conductor, said inductive member and through said varactor capacitance to adjust its capacitance, and a bypass capacitor connected in parallel with said bias current supply means to decouple it from said electromagnetic waves.

2. Apparatus as claimed in claim 1 and wherein the said electrical length of said transmission line is substantially one half-wavelength, $\lambda/2$, at the said resonant frequency.

3. Apparatus as claimed in claim 1 and wherein said varactor capacitance and said bypass capacitor are electrically connected in series between the said inner conductor and the said outer conductor of the said transmission line at the said other end thereof, and the said inductive member is connected to the said outer conductor.

4. Apparatus as claimed in claim 3 and wherein said inductive member is a spiral conductive lead, connected at its inner end to said inner conductor and at its outer end to said outer conductor.

5. Apparatus as claimed in claim 1, wherein said varactor capacitance has one electrode connected to said inner conductor and one electrode connected to said outer conductor, and said bypass capacitance has one connection connected to said outer conductor and one connection connected to said inductive member.

6. Apparatus as claimed in claim 5 and wherein said inductive member is a spiral conductive lead, connected at its inner end to said inner conductor and at its outer end to said connection of said bypass capacitance.